(12) United States Patent
Dressel et al.

(10) Patent No.: US 10,805,015 B1
(45) Date of Patent: Oct. 13, 2020

(54) METHOD AS WELL AS TEST SYSTEM FOR TESTING A DEVICE UNDER TEST

(71) Applicant: Rohde & Schwarz GmbH & Co. KG, Munich (DE)

(72) Inventors: Wolfgang Dressel, Munich (DE); Alexander Roth, Munich (DE); Florian Ramian, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 16/797,870

(22) Filed: Feb. 21, 2020

(51) Int. Cl.
*H04B 17/00* (2015.01)
*G01R 27/28* (2006.01)

(52) U.S. Cl.
CPC ......... *H04B 17/0085* (2013.01); *G01R 27/28* (2013.01)

(58) Field of Classification Search
CPC .......................... H04B 17/0085; G01R 27/28
See application file for complete search history.

(56) References Cited

U.S. PATENT DOCUMENTS

| | | | |
|---|---|---|---|
| 5,533,068 A | 7/1996 | Muto | |
| 9,116,187 B1 | 8/2015 | Owen et al. | |
| 10,281,510 B1 | 5/2019 | Tsironis | |
| 2005/0137814 A1 | 6/2005 | Kelly et al. | |
| 2007/0073499 A1* | 3/2007 | Sawyer | G01R 27/28 702/75 |
| 2007/0182424 A1 | 8/2007 | Benedikt et al. | |
| 2007/0194776 A1 | 8/2007 | Bossche | |
| 2011/0163762 A1 | 7/2011 | Marchetti et al. | |
| 2013/0197848 A1 | 8/2013 | Sariaslani et al. | |
| 2016/0124032 A1 | 5/2016 | Simpson | |
| 2017/0153280 A1 | 6/2017 | Mikulka et al. | |
| 2019/0081822 A1 | 3/2019 | Simpson et al. | |
| 2020/0103458 A1 | 4/2020 | Anderson et al. | |

FOREIGN PATENT DOCUMENTS

| | | |
|---|---|---|
| CN | 101672877 A | 3/2010 |
| CN | 102508045 A | 6/2012 |
| CN | 108931704 A | 12/2018 |
| CN | 109581053 A | 4/2019 |
| DE | 4006869 A1 | 9/1991 |
| EP | 1367402 A1 | 12/2003 |
| FR | 2679038 A1 | 1/1993 |
| JP | 2000286908 A | 10/2000 |

* cited by examiner

*Primary Examiner* — Curtis B Odom
(74) *Attorney, Agent, or Firm* — Christensen O'Connor Johnson Kindness PLLC

(57) ABSTRACT

A method for testing a device under test by using a test system is disclosed. The method comprises: generating a wideband modulated signal; forwarding the wideband modulated signal to an input of a device under test; separating an electromagnetic wave reflected at the input by the directional element; forwarding the reflected electromagnetic wave to a vector signal analyzer; processing a reference signal associated with the wideband modulated signal; and determining a channel response by taking the reference signal and at least one scattering parameter of the device under test into account, wherein the scattering parameter depends on the reflected electromagnetic wave. Further, the present disclosure relates to a test system.

19 Claims, 1 Drawing Sheet

METHOD AS WELL AS TEST SYSTEM FOR TESTING A DEVICE UNDER TEST

FIELD OF THE DISCLOSURE

Embodiments of the present disclosure relate generally to a method for testing a device under test by using a test system. Further, embodiments of the present disclosure relate generally to a test system for testing a device under test.

BACKGROUND

Nowadays, many electronic devices that process electromagnetic signals have to be tested with regard to different characteristics. Accordingly, at least two different test stations are required to perform these different tests. For instance, a first test station comprises a vector network analyzer (VNA) that is used to measure a port matching of the respective device, namely measuring the respective port matching parameters of the device under test. The port matching measurement is typically done by means of an approach based on a continuous wave (CW) signal. Moreover, a second test station may be used to test the respective device, which comprises a vector signal generator (VSG) and a vector signal analyzer (VSA). The VSG and VSA are used to measure certain parameters requiring a modulated stimulus. The respective parameters obtained by means of the second test station may be used for determining an adjacent channel leakage power ratio (ACLR) or an error vector magnitude (EVM). Generally, ACLR defines the ratio of transmitted power on an assigned channel to power received in an adjacent channel. EVM is a measure to quantify the performance of the electronic device to be tested, for example a receiver or a transmitter.

However, the respective tests take long, as a continuous wave signal is used for testing the port matching, resulting in a respective frequency sweep of the test signal. In addition, the device under test has to be placed into two different test stations subsequently, which in turn results in higher costs due to the different test stations and more efforts.

SUMMARY

Accordingly, there is a need for a cost-efficient and fast way to test a device under test.

Embodiments of the present disclosure provide a method for testing a device under test by using a test system. In an embodiment, the method comprises the steps of:

generating a wideband modulated signal by at least one vector signal generator, forwarding the wideband modulated signal to an input of the device under test via at least one directional element, separating an electromagnetic wave reflected at the input of the device under test by the directional element, forwarding the reflected electromagnetic wave to a vector signal analyzer via the directional element, wherein the vector signal analyzer has a defined phase relation with the vector signal generator, processing a reference signal by the vector signal analyzer, wherein the reference signal is associated with the wideband modulated signal, and determining a channel response by taking the reference signal and at least one scattering parameter of the device under test into account, which is determined by the vector signal analyzer, wherein the scattering parameter depends on the reflected electromagnetic wave.

Furthermore, embodiments of the present disclosure provide a test system for testing a device under test. In an embodiment, the test system comprises at least one vector signal generator configured to generate a wideband modulated signal. The test system comprises at least one vector signal analyzer having a defined phase relation with the vector signal generator. Moreover, the test system comprises at least one directional element configured to separate incident electromagnetic waves and reflected electromagnetic waves. The directional element has at least a first port, a second port and a third port. The vector signal generator is connected with the directional element via the first port. The vector signal analyzer is connected with the directional element via the second port. The third port is provided for connecting a device under test. The vector signal generator is configured to forward the wideband modulated signal to the device under test via the directional element. The directional element is configured to separate an electromagnetic wave reflected at an input of the device under test. The vector signal analyzer is configured to process a reference signal that is associated with the wideband modulated signal. The vector signal analyzer is configured to determine a channel response by taking the reference signal and at least one scattering parameter of the device under test into account, which is determined by the vector signal analyzer, wherein the scattering parameter depends on the reflected electromagnetic wave.

Accordingly, a wideband modulated signal is used for determining at least one scattering parameter of the device under test (port matching measurement). In some embodiments, a vector signal generator and a vector signal analyzer are used together instead of a vector network analyzer for measuring the port matching of the device under test. Therefore, the same test system, for example the same setup of the test system, can be used for measuring the port matching (parameters) as well as other parameters that require a modulated stimulus, for instance parameters associated with ACLR and/or EVM measurements.

Generally, the wideband modulated signal provided by the vector signal generator does not only cover a given frequency range, but also a certain amplitude range. Therefore, the wideband modulated signal combines a continuous wave frequency sweep and level sweep into a single stimulus. Therefore, the entire testing time can be reduced appropriately, as the single stimulus is sufficient instead of using a continuous wave frequency and level sweep.

The channel response may also be called channel frequency response, frequency response or rather transfer function. In general, the channel response is associated with the vector signal generator and the device under test. In some embodiments, the channel response corresponds to a quantitative measure of the output spectrum of a system in response to a stimulus. Therefore, the channel response is used to characterize dynamics of the system. The respective system comprises the vector signal generator and the device under test. The scattering parameters of the device under test influence the channel response and, therefore, they are taken into consideration when determining the channel response.

The directional element is generally configured to separate incident electromagnetic waves, namely the wideband modulated signal or rather the single stimulus of the vector signal generator, and reflected electromagnetic waves, namely the ones reflected at the input of the device under test.

For instance, the directional element is established by the directional coupler, for example a 3-port directional coupler or a 4-port directional coupler.

Further, the vector signal generator, namely the respective signal source providing the stimulus, as well as the vector signal analyzer, namely the signal receiver, are capable of transmitting/receiving wideband modulated (arbitrary) signals rather than continuous wave signals.

In general, the test system, for example the respective test setup of the test system, is enabled to allow typical and known vector network analyzer calibration routines and standards.

Furthermore, the present disclosure allows smaller and more cost-effective test systems or rather test setups.

According to an aspect, the reflected electromagnetic wave is associated with the wideband modulated signal forwarded to the device under test. The respective reflected electromagnetic wave forwarded to the device under test is reflected partly at the input of the device under test due to an impedance mismatch.

Another aspect provides that the channel response is associated with a channel established between the vector signal generator and the device under test. In other words, the channel response, also called transfer function, would correspond to the (inherent) forward transmission of the device under test in case of a matched device under test.

A further aspect provides that the at least one scattering parameter also depends on an incident electromagnetic wave associated with the wideband modulated signal. Accordingly, the at least one scattering parameter used for determining the channel response depends on the incident electromagnetic wave, namely the one associated with the wideband modulated signal generated, as well as the reflected electromagnetic wave. Thus, the at least one scattering parameter corresponds to the S11 parameter associated with the input reflection coefficient. The S11 parameter is obtained by dividing the reflected electromagnetic wave by the incident electromagnetic wave. This can be done by the vector signal analyzer, which receives the reflected electromagnetic wave via the directional element as well as the reference signal that is associated with the wideband modulated signal generated by the vector signal generator.

According to another aspect, the vector signal analyzer receives a transmitted signal from an output of the device under test. The transmitted signal, namely the one that is processed by the device under test, is measured by the vector signal analyzer. Hence, the vector signal analyzer is connected with the output of the device under test for receiving the transmitted signal. The transmitted signal is used to determine the S21 parameter that is assigned to the forward transmission of the device under test.

In general, the transmitted signal is associated with the wideband modulated signal that has been forwarded to the input of the device under test.

In some embodiments, the channel response is determined by taking the reference signal, a S11 parameter of the device under test and a S21 parameter of the device under test, into account. The respective scattering parameters, namely the S11 parameter and the S21 parameter, are determined by the vector signal analyzer based on the received signals or rather electromagnetic waves, namely the reference signal, the reflected electromagnetic wave received from the directional element as well as the transmitted signal received from the output of the device under test.

According to another aspect, a modulation accuracy and/or a non-linear effect are/is determined simultaneously. The modulated accuracy may be determined by the EVM or ACLR measurement(s). The non-linear effect may correspond to a compression. In some embodiments, the above-mentioned information may be obtained simultaneously when obtaining the at least one scattering parameter. Therefore, the entire testing time required can be reduced further.

Furthermore, hot S-parameter measurements may be performed. This means that the device under test is tested under real-world conditions. Therefore, signals typically used when the device under test is operated are used for the testing purposes. In other words, the idea of hot S-parameter measurements is to put the device under test under realistic operating conditions by applying the appropriate large-signal stimulus signal, namely the wideband modulated signal provided by the vector signal generator.

According to another aspect, a second directional element is connected with an output of the device under test. Therefore, a S22 parameter of the device under test can be determined by the test system. The S22 parameter corresponds to the output reflection coefficient.

In some embodiments, the S22 parameter may be determined in a similar manner as the S11 parameter is determined as mentioned above. However, the respective signal, namely the wideband modulated signal provided by the vector signal generator, is forwarded to the output of the device under test instead of its input such that an electromagnetic wave reflected at the output of the device under test is forwarded to the vector signal analyzer via the directional element.

Moreover, the reverse transmission, namely the S12 parameter, may also be determined in a similar manner as described above with regard to the S21 parameter.

According to an aspect, different S-parameters of the device under test are measured subsequently. Hence, a single port of the vector signal analyzer is connected with different components of the test system and/or ports of the device under test in a subsequent manner.

According to another aspect, different S-parameters of the device under test are measured simultaneously while mapping respective electromagnetic waves to different ports of the vector signal analyzer. Hence, the vector signal analyzer has several ports that are connected with different components of the test system and/or different ports of the device under test simultaneously. Hence, the vector signal analyzer is configured to receive the respective electromagnetic waves that are used to determine the different S-parameters of the device under test.

A system error correction may be used to define a reference plane and compensate for at least one non-ideal component within the test system. The test system may be configured to use system error correction to define a reference plane and to compensate for at least one non-ideal component within the test system. Accordingly, a mismatch correction is provided that generally improves the measurement of the parameters that required a modulated stimulus.

The vector signal analyzer may receive the reference signal via a data input and/or a radio frequency input connected with the vector signal generator. Therefore, a data associated with the wideband modulated signal may be provided and/or loaded via the data input, wherein the data is processed by the vector signal analyzer in order to generate the reference signal based on the data. The data input may relate to an interface for receiving a data storage medium. Alternatively, the data input is a data interface that is connected to a corresponding data interface of the vector signal generator.

Alternatively, a radio frequency connection may be established between the vector signal analyzer and the vector signal generator such that the wideband modulated signal is directly forwarded to the vector signal analyzer.

The vector signal analyzer may obtain respective information with regard to the incident wave by the reference signal in order to determine the S11 parameter.

Generally, S-parameters of the device under test, a modulation accuracy and a non-linear effect are determined with the same setup of the test system. In other words, the test system may be configured to perform S-parameter measurements, modulation accuracy measurements and non-linear effects measurements on the same setup. Accordingly, different kinds of measurements can be performed simultaneously in order to determine the different measurement parameters mentioned above. In some embodiments, the respective measurements may be done simultaneously by using the single wideband measurement signal rather than a continuous wave sweep. In other words, the same single stimulus can be used for all different kinds of measurements.

An aspect provide that the test system comprises a test device configured to test the device under test. The test device has a housing that encompasses the vector signal generator, the vector signal analyzer and the directional element. Accordingly, a single device is used for testing the device under test. The directional element is an internal directional element.

Alternatively, the respective components of the test system are formed separately with respect to each other, wherein respective cables or rather connection lines are provided for interconnecting these components.

Moreover, a significant speed advantage is provided by the present disclosure. Since the same stimulus can be used for all measurements, additional time saving is possible.

Furthermore, several vector signal generators and/or several vector signal analyzers may be used that have a defined (known) phase relation. Alternatively, a reference receiver may be used to ensure the defined phase relation.

In addition, the device under test may correspond to a 1-port device under test. Generally, the present disclosure is scalable from 1- to N-port devices under test. However, the number of vector signal generators and/or vector signal analyzers does not necessarily scale with the number of ports of the device under test.

The present disclosure also ensures load-pull and/or source-pull. Load-pull corresponds to the process of systematically varying the load impedance presented to the device under test and monitoring a single or set of performance parameters. Source-pull corresponds to the process of systematically varying the source impedance presented to the device under test and monitoring a single or set of performance parameters.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
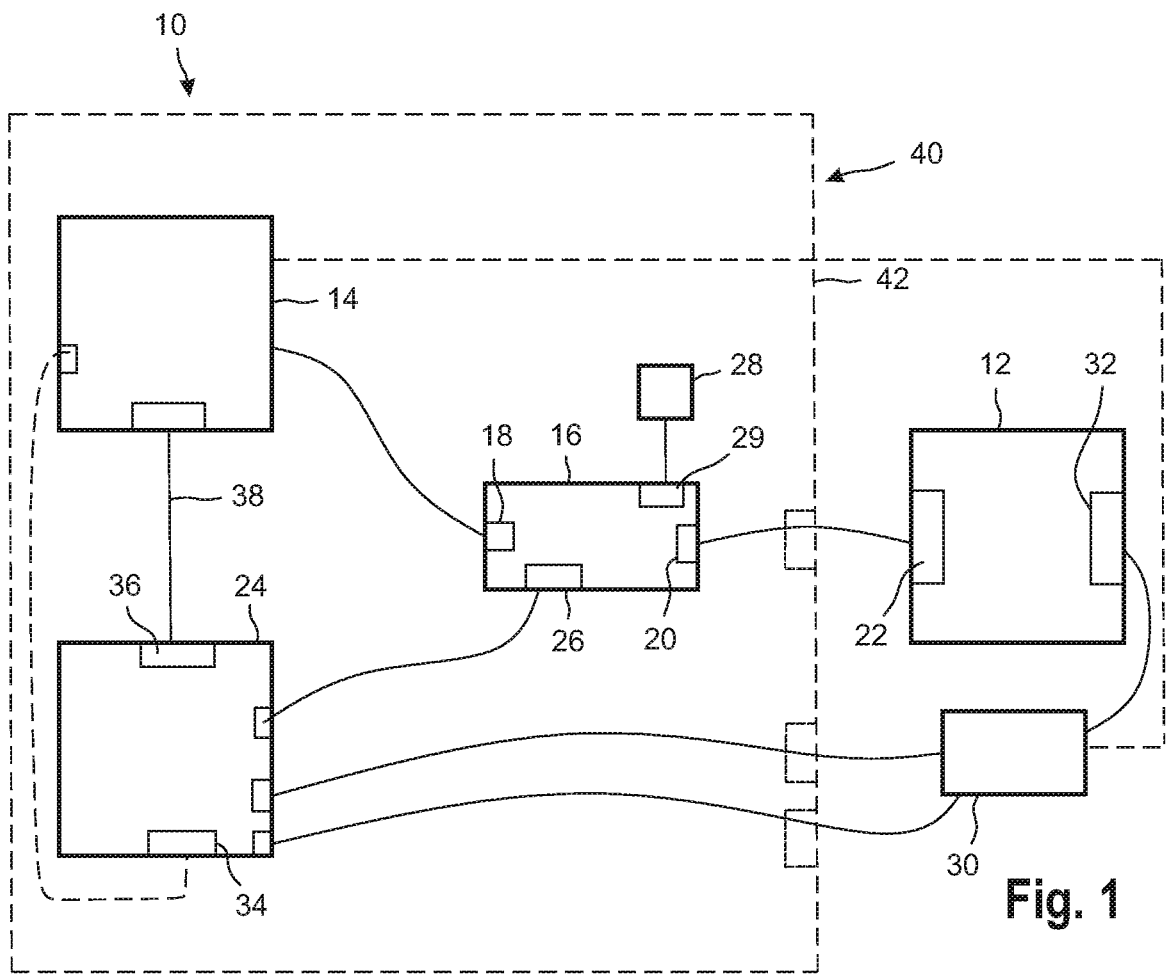
FIG. 1 schematically shows a representative embodiment of a test system according to an aspect of the present disclosure.

In FIG. 1, a test system 10 is shown that is used to test a device under test 12. The test system 10 comprises at least one vector signal generator 14 that is configured to generate a wideband modulated signal that encompasses a certain frequency range as well as a certain amplitude range. The vector signal generator 14 is connected with a directional element 16, for example a first port 18 of the directional element 16.

The directional element 16 also has a second port 20 that is assigned to the device under test 12 such that a signal generated by the vector signal generator 14 can be forwarded to an input 22 of the device under test 12 via the directional element 16, for example the first port 18 as well as the second port 20 of the directional element 16.

Furthermore, the test system 10 has a vector signal analyzer 24 that is connected with a third port 26 of the directional element 16.

The directional element 16 may be assigned to a matched termination 28 via its fourth port 29, which ensures that port matching measurements of the device under test 12 can be performed by the respective setup of the test system 10 in an appropriate manner. Alternatively, the matched termination 28 may be integrated.

The test system 10 may also comprise a second directional element 30 that is connected to an output 32 of the device under test 12, wherein the second directional element 30 is optional or rather only used in certain measurements, as will be described later.

Generally, the vector signal analyzer 24 may also be assigned to the output 32 of the device under test 12 in order to receive a transmitted signal provided at the output 32 of the device under test 12, as will be described later.

The vector signal analyzer 24 may comprise a data input 34 via which a data, for instance a data file, may be inputted, which is processed by the vector signal analyzer 24. The data is used to obtain a reference signal associated with the wideband modulated signal generated by the vector signal generator 14.

The data input 34 can be configured to receive a data storage medium that comprises information with regard to the wideband modulated signal generated. The data input 34 may also be established by an interface via which the vector signal analyzer 24 has a data connection to the vector signal generator 14 for receiving data from the vector signal generator 14, which relates to the wideband modulated signal generated.

The vector signal analyzer 24 may also comprise a radio frequency input 36 that is connected to the vector signal generator 14 via a respective radio frequency line 38. Thus, the vector signal analyzer 24 receives a radio frequency signal originating from the vector signal generator 14, which is associated with the wideband modulated signal generated.

In any case, the vector signal analyzer 24 receives the data or rather the radio frequency signal such that the reference signal is obtained by the vector signal analyzer 24, wherein the reference signal is associated with the wideband modulated signal generated by the vector signal generator 14.

In general, the test system 10 is enabled to determine scattering parameters (S-parameters) of the device under test 12, a modulation accuracy and at least one non-linear effect with the same setup of the test system 10. This means that it is not necessary to establish two different test stations or rather different test setups in order to determine the above-mentioned parameters.

Figure 2:
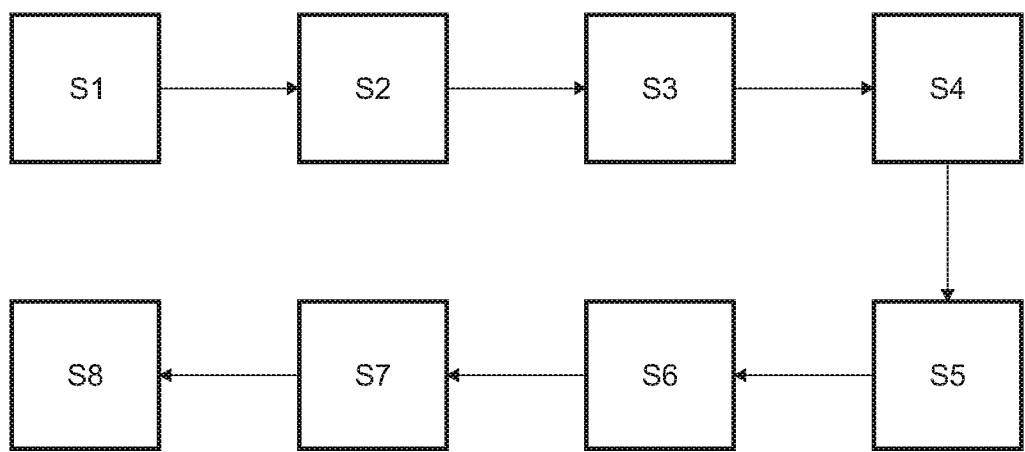
FIG. 2 shows a flow-chart illustrating a representative method of testing a device under test according to an embodiment of the present disclosure.

This will be described hereinafter in more detail with reference to FIG. 2 illustrating a flow-chart of a method for testing the device under test 12 by using the test system 10 as illustrated in FIG. 1.

In a first step S1, a wideband modulated signal is generated by the vector signal generator 14.

In a second step S2, the wideband modulated signal is forwarded from the vector signal generator 14 to the input 22 of the device under test 12 via the directional element 16. The directional element 16 is generally configured to separate an incident electromagnetic wave and a reflected electromagnetic wave.

In a third step S3, an electromagnetic wave reflected at the input 22 of the device under test 12 is separated by the directional element 16, which is reflected due to an impedance mismatch of the input 22 with respect to the test system 10.

In a fourth step S4, the reflected electromagnetic wave is forwarded to the vector signal analyzer 24 via the directional element 16, namely the third port 26 of the directional element 16, to which the vector signal analyzer 24 is connected.

In a fifth step S5, a reference signal associated with the wideband modulated signal generated by the vector signal generator 14 is processed by the vector signal analyzer 24. The reference signal may be obtained via the data input 34 or rather the radio frequency input 36 that is connected with the vector signal generator 14.

In a sixth step S6, at least one scattering parameter of the device under test 12 is determined by the vector signal analyzer 24. For instance, the vector signal analyzer 24 determines the S11 parameter that depends on the reflected electromagnetic wave obtained from the directional element 16, for example its third port 26, as well as an incident electromagnetic wave. The incident wave may be obtained from the reference signal. The S11 parameter is obtained by dividing the reflected electromagnetic wave by the incident electromagnetic wave.

Accordingly, the at least one scattering parameter depends on the reflected electromagnetic wave as well as the incident electromagnetic wave that is associated with the wideband modulated signal generated by the vector signal generator 14.

In a seventh step S7, a transmitted signal is received by the vector signal analyzer 24, which was outputted by the device under test 12 based on the wideband modulated signal forwarded to the device under test 12. In other words, the transmitted signal is received from the output 32 of the device under test 12.

In an eighth step S8, a channel response is determined by taking the reference signal and the at least one scattering parameter of the device under test 12 into account. The channel response is determined by the vector signal analyzer 24. The channel response is also known as channel frequency response, frequency response or rather transfer function. In some embodiments, the channel response is associated with the channel established between the vector signal generator 14 and the device under test 12.

In some embodiments, the channel response is determined by taking the S11 parameter as well as the S21 parameter of the device under test 12 into account, wherein the latter one is derived from the transmitted signal.

Therefore, the vector signal analyzer 24 is configured to determine the S21 parameter of the device under test 12.

Moreover, further scattering parameters of the device under test 12 can be determined by using the vector signal generator 14 as well as the vector signal analyzer 24.

For instance, the S22 parameter is determined by using the second directional element 30 that is connected to the output 32 of the device under test 12. The vector signal generator 14 also generates the wideband modulated signal that is forwarded to the output 32 of the device under test 12, wherein the second directional element 30 separates an electromagnetic wave reflected at the output 32 of the device under test 12. Hence, the vector signal analyzer 24 takes the reference signal as well as the electromagnetic wave reflected at the output 32 of the device under test 12 into account to determine the S22 parameter.

Moreover, the S12 parameter may also be determined in a similar manner as described above.

Besides the scattering parameters, the same setup of the test system 10 can be used to simultaneously measure a modulation accuracy as well as non-linear effects. The modulation accuracy can be determined by an error vector magnitude (EVM) measurement and/or an adjacent channel leakage power ratio (ACLR) measurement. The at least one non-linear effect may relate to a compression.

The respective measurements can be done simultaneously, as the wideband modulated signal is used for performing the respective measurements. The wideband modulated signal encompasses a certain frequency range as well as a certain amplitude range, which correspond to a continuous wave frequency and level sweep.

Therefore, the time required for the measurements can be reduced significantly. In other words, a significant speed advantage in measuring the respective scattering parameters is obtained, as the scattering parameters are measured by the wideband modulated signal instead of a continuous wave frequency and level sweep.

In addition, the entire measurement time for determining the respective parameters can be reduced further, as the same single stimulus, namely the wideband modulated signal, can be used for all different kinds of measurements mentioned above.

In some embodiments, the S-parameter measurements can be performed by hot S-parameter measurements, wherein real operation signals are generated and forwarded to the device under test 12.

In addition, a system error correction may be used to define a reference plane and compensate for at least one non-idle component within the test system 10 such that the respective measurements can be performed in a more accurate manner, for example the error vector magnitude (EVM) measurement and/or the adjacent channel leakage power ratio (ACLR) measurement.

The different S-parameters of the device under test 12 can be measured subsequently while connecting a respective port of the vector signal analyzer 24 with a respective component of the test system 10 and/or port of the device under test 12 in a subsequent manner.

Alternatively, the different S-parameters of the device under test 12 can be measured simultaneously while mapping respective electromagnetic waves to different ports of the vector signal analyzer 24 simultaneously. Furthermore, several ports of the vector signal analyzer 24 are occupied in the respective test setup of the test system 10.

In general, the S-parameters of the device under test 12, a modulation accuracy and a non-linear effect can be determined with the same setup of the test system 10 simultaneously. The same stimulus, namely the wideband modulated signal generated by the vector signal generator 14, can be used to determine the respective different kinds of parameters.

Accordingly, costs and time can be reduced, as a single test setup is sufficient to obtain and measure the respective parameters rather than two different test stations or rather test setups.

The vector signal generator 14, the directional element 16 as well as the vector signal analyzer 24 may be encompassed in a single testing device 40 that has a common housing 42 illustrated by dashed lines in FIG. 1.

The housing 42 encompasses the respective components of the test system 10, namely the vector signal generator 14, the directional element 16 as well as the vector signal analyzer 24.

In general, time and cost savings can be obtained by using the wideband modulated signal as the single stimulus rather than a continuous wave sweep, which is done by a vector network analyzer. In addition, the costs for testing can be reduced further, as it is not necessary to purchase a relatively expensive vector network analyzer.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for testing a device under test by using a test system, said method comprising:
    generating a wideband modulated signal by at least one vector signal generator;
    forwarding said wideband modulated signal to an input of a device under test via at least one directional element;
    separating an electromagnetic wave reflected at said input of said device under test by said directional element;
    forwarding said reflected electromagnetic wave to a vector signal analyzer via said directional element, said vector signal analyzer having a defined phase relation with said vector signal generator;
    processing a reference signal by said vector signal analyzer, wherein said reference signal is associated with said wideband modulated signal; and
    determining a channel response by taking said reference signal and at least one scattering parameter of said device under test into account, which is determined by said vector signal analyzer, wherein said scattering parameter depends on said reflected electromagnetic wave.

2. The method according to claim 1, wherein said reflected electromagnetic wave is associated with said wideband modulated signal forwarded to said device under test.

3. The method according to claim 1, wherein said channel response is associated with a channel established between said vector signal generator and said device under test.

4. The method according to claim 1, wherein said at least one scattering parameter also depends on an incident electromagnetic wave associated with said wideband modulated signal.

5. The method according to claim 1, wherein said vector signal analyzer receives a transmitted signal from an output of said device under test.

6. The method according to claim 1, wherein said channel response is determined by taking said reference signal, a S11 parameter of said device under test and a S21 parameter of said device under test into account.

7. The method according to claim 1, wherein at least one of a modulation accuracy and a non-linear effect is determined simultaneously.

8. The method according to claim 1, wherein hot S-parameter measurements are performed.

9. The method according to claim 1, wherein a second directional element is connected with an output of said device under test, and wherein a S22 parameter of said device under test is determined by said vector signal generator and said vector signal analyzer.

10. The method according to claim 1, wherein different S-parameters of said device under test are measured subsequently.

11. The method according to claim 1, wherein different S-parameters of said device under test are measured simultaneously while mapping respective electromagnetic waves to different ports of said vector signal analyzer.

12. The method according to claim 1, wherein a system error correction is used to define a reference plane and to compensate for at least one non-ideal component within said test system.

13. The method according to claim 1, wherein said vector signal analyzer receives said reference signal via at least one of a data input and a radio frequency input connected with said vector signal generator.

14. The method according to claim 1, wherein S-parameters of said device under test, a modulation accuracy and a non-linear effect are determined with the same setup of said test system.

15. A test system for testing a device under test, said test system comprising:
    at least one vector signal generator configured to generate a wideband modulated signal;
    at least one vector signal analyzer having a defined phase relation with said vector signal generator; and
    at least one directional element configured to separate incident electromagnetic waves and reflected electromagnetic waves,
    wherein said directional element has at least a first port, a second port and a third port, said vector signal generator being connected with said directional element via said first port, said vector signal analyzer being connected with said directional element via said second port, and said third port being provided for connecting a device under test,
    wherein said vector signal generator is configured to forward said wideband modulated signal to said device under test via said directional element,
    wherein said directional element is configured to separate an electromagnetic wave reflected at an input of said device under test,
    wherein said vector signal analyzer is configured to process a reference signal that is associated with said wideband modulated signal, and
    wherein said vector signal analyzer is configured to determine a channel response by taking said reference signal and at least one scattering parameter of said device under test into account, which is determined by said vector signal analyzer, wherein said scattering parameter depends on said reflected electromagnetic wave.

16. The test system according to claim 15, wherein said directional element is established by a directional coupler.

17. The test system according to claim 15, wherein said test system comprises a test device configured to test said device under test, said test device having a housing that encompasses said vector signal generator, said vector signal analyzer and said directional element.

18. The test system according to claim 15, wherein said test system is configured to perform S-parameter measurements, modulation accuracy measurements and non-linear effects measurements on the same setup.

19. The test system according to claim 15, wherein said test system is configured to use system error correction to define a reference plane and to compensate for at least one non-ideal component within said test system.

\* \* \* \* \*